United States Patent [19]
Shen

[11] Patent Number: 5,804,492
[45] Date of Patent: Sep. 8, 1998

[54] METHOD OF FABRICATING AN ISOLATION REGION FOR SEMICONDUCTOR DEVICE

[75] Inventor: Yun-Hung Shen, Taipei, Taiwan

[73] Assignee: Taiwan Semiconductor Manufacturing Co., Ltd., Hsinchu, Taiwan

[21] Appl. No.: 873,051

[22] Filed: Jun. 11, 1997

[51] Int. Cl.$^6$ ................................................ H01L 21/76
[52] U.S. Cl. ........................... 438/439; 438/947; 438/696
[58] Field of Search ................................... 438/439, 696, 438/947, 229

[56] References Cited

U.S. PATENT DOCUMENTS 5,173,444  12/1992  Kawamura .

*Primary Examiner*—George R. Fourson
*Attorney, Agent, or Firm*—Christensen O'Connor Johnson & Kindness PLLC

[57] ABSTRACT

A method of forming an isolation region is provided. A silicon oxide layer (4) is formed on a wafer (2). A first silicon oxynitride (6) layer is formed on the silicon oxide layer, and a silicon nitride layer (8) is formed on the first silicon oxynitride layer. The silicon nitride layer and a portion of the silicon oxynitride layer are etched. A TEOS-oxide layer (10) is deposited on the first silicon oxynitride layer and on the silicon nitride layer. Sidewall spacers (12) are formed on the sidewalls of the silicon nitride layer. A second silicon oxynitride layer (14) is deposited on the silicon nitride layer, sidewall spacers, and the silicon oxide layer. A second silicon nitride layer (16) is deposited and formed on the second oxynitride layer. A sacrificial oxide layer (18) is deposited on the second silicon nitride layer. A portion of the sacrificial oxide layer is etched. The second silicon oxynitride layer and the second silicon nitride layer that are not covered by the oxide layer are removed by dry etching. The sidewall spacers are subsequently removed to create grooves (20) adjacent the first silicon nitride layer. A thermal oxidation process is performed to form isolation regions (22) adjacent the first silicon nitride layer and in the wafer, and the first silicon nitride layer, the second silicon nitride layer, and the second silicon oxynitride layer are removed.

14 Claims, 5 Drawing Sheets

METHOD OF FABRICATING AN ISOLATION REGION FOR SEMICONDUCTOR DEVICE

FIELD OF THE INVENTION

The present invention relates to a method of fabricating an isolation region for semiconductor devices, and more specifically, to a method for controlling the scale of an isolation region by using spacers.

BACKGROUND OF THE INVENTION

Isolation techniques such as local oxide of silicon (LOCOS) and shallow trench isolation (STI) have been developed to isolate devices in integrated circuits. In particular, LOCOS has been a widely used isolation technique.

In the LOCOS approach, a silicon oxide layer and a silicon nitride composition layer are selectively grown on a semiconductor wafer, such as a silicon wafer. The silicon oxide layer provides a cushion for reducing stresses between the silicon wafer and the silicon nitride layer. Active regions of the wafer are covered by the silicon oxide/silicon nitride composition layer. The silicon oxide/silicon nitride composition structure serves as a mask for subsequent processing. Then, field oxide (FOX) isolations are formed on the unmasked regions by thermal oxidation in oxygen. Typically, the FOX is thermally grown by wet oxidation at temperatures around 1000° C. for 2 to 4 hours. When FOX isolations are grown, the active regions remain covered by the silicon oxide/silicon nitride composition layer. This prevents oxidation of the silicon wafer, and the oxide grows where there is no silicon nitride masking.

However, at the edges of the silicon nitride, some oxidant laterally diffuses. Oxide forms under the nitride edges and lifts the nitride edges. This lateral extension of the field oxide into the active region of the wafer is known as "bird's beak." Subsequently, the silicon nitride layer is removed and the silicon oxide is stripped by HF solution.

The extended bird's beak penetration effect can limit packing density because increased overlap area is needed for forming contacts at the ends of small devices. Further, reducing the size of conventional LOCOS is limited, due to photolithography itself. This limits the sizes to which devices can be scaled down. A variety of LOCOS-based modifications, such as polybuffered LOCOS, sidewall mask isolation (SWAMI), and sealed-interface local oxidation (SILO), have been developed in attempts to reduce the undesirable encroachment of bird's beak. However, there is an unmet need in the art for a method of forming an isolation region between devices such that reducing the size of the isolation region is not limited by lithography.

SUMMARY OF THE INVENTION

In accordance with the present invention, a method of forming an isolation region is provided. A silicon oxide layer is first formed on a silicon wafer by thermal oxidation. A first silicon oxynitride layer is formed in a furnace at a temperature of about 400° to 450° C. A silicon nitride layer is formed on the first silicon oxynitride layer to a thickness of about 1200 to 1600 Å. After the silicon nitride layer is formed, a photoresist is patterned on the silicon nitride layer to define active areas. The photoresist is used as a mask, and the silicon nitride layer and a portion of the silicon oxynitride layer are etched. The photoresist is removed, and a tetraethyl orthosilicate (TEOS)-oxide layer is deposited on the first silicon oxynitride layer and on the silicon nitride layer. Sidewall spacers are formed by etching the sidewalls of the etched silicon nitride layer. Because the dimensions, or scale, of the isolation regions are dependent on the widths of the sidewall spacers, the scale of the isolation regions can be controlled by forming the sidewall spacers.

A second silicon oxynitride layer is deposited on the silicon nitride layer, the sidewall spacers and the silicon oxide layer. A second silicon nitride layer is deposited and formed on the second oxynitride layer. A sacrificial oxide layer is deposited on the second silicon nitride layer. phosphosilicate glass (PSG), borophosphosilicate glass(BPSG), or oxide can be used as the sacrificial oxide layer. A portion of the sacrificial oxide layer is etched, and the residual oxide layer serves as an etching mask for subsequent processing. The second silicon oxynitride layer and the second silicon nitride layer that are not covered by the oxide layer are removed by dry etching. The sidewall spacers are removed to create grooves adjacent the first silicon nitride layer. Isolation regions adjacent the first silicon nitride layer and in the wafer are formed by thermal oxidation using the first silicon nitride layer as a mask.

The first silicon nitride layer, the second silicon nitride layer, and the second silicon oxynitride layer are removed, such as by using a heated solution of phosphorus acid. The silicon oxide layer is removed, such as by using HF or BOE. Thus, isolation regions between devices are formed. A blanket planarization is performed to remove portions of the isolation regions for achieving a planarization surface of the wafer.

As a result, the spacing used to form an isolation region between active areas is controlled by using sidewall spacers. Therefore, the isolation region can be defined beyond the limitation of photolithography.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE PREFERRED EMBODIMENT

Figure 1:
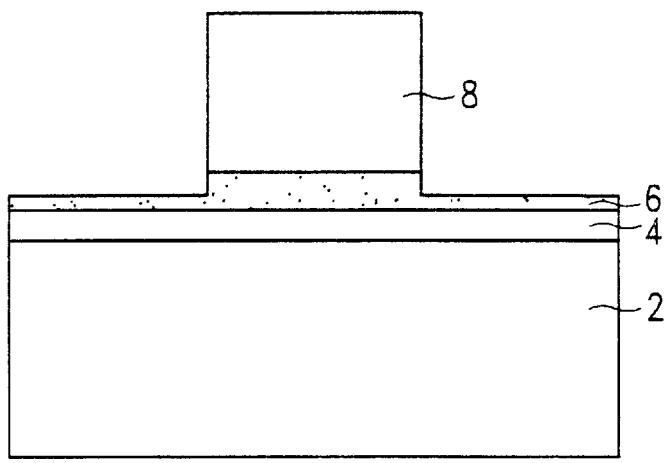
FIG. 1 is a cross-sectional view of a semiconductor wafer illustrating an initial stage in accordance with the present invention.

Referring to FIG. 1, a semiconductor device formed according to the present invention suitably includes a single crystal wafer 2 with a <100> crystallographic orientation. In a preferred embodiment, a silicon oxide layer 4 is first formed to a thickness of about 300 to 400 Å. However, the silicon oxide layer 4 is suitably formed using a chemical vapor deposition (CVD) process, with a tetraethyl orthosilicate (TEOS) source, at a temperature between about 600° to 800° C. and a pressure between about 0.1 to 10 torr. Alternatively, the silicon oxide layer 4 can also be formed using thermal oxidation. A first silicon rich silicon oxynitride layer 6 is then formed on the silicon oxide layer 4 in a furnace at about 400° to 450° C. The reaction gases of the process are $SiH_4$, $N_2O$ and $NH_3$. The thickness of the first silicon rich silicon oxynitride layer 6 ranges between about 200 to 500 Å. The silicon oxide layer 4 and the first silicon rich silicon oxynitride layer 6 act together as a pad layer. The first silicon rich silicon oxynitride layer 6 prevents oxygen from penetrating in subsequent processing. Further, the silicon oxynitride layer 6 also acts as a cushion between the silicon oxide layer 4 and a subsequent silicon nitride layer for reducing stress during subsequent oxidation for forming isolation regions. In addition, the silicon oxide layer 4 reduces stress between the silicon wafer 2 and the first silicon oxynitride layer 6 during subsequent oxidation for forming isolation regions.

Subsequently, a silicon nitride layer 8 is formed on the first silicon oxynitride layer 6 to a thickness of about 1200 to 1600 Å. Still referring to FIG. 1, after the silicon nitride layer 8 is formed, a photoresist is patterned on the silicon nitride layer 8 to define active areas. The silicon nitride layer 8 and a portion of the silicon oxynitride layer 6 are etched using the photoresist as an etching mask. A portion of the silicon nitride layer 8 remains on the silicon oxynitride layer 6. The areas that are covered by the silicon nitride layer 8 remaining will be the active areas formed in later processing. In the preferred embodiment, the silicon nitride layer 8 is etched using $CF_4$ plasma as the etchant. The photoresist is then removed.

Figure 2:
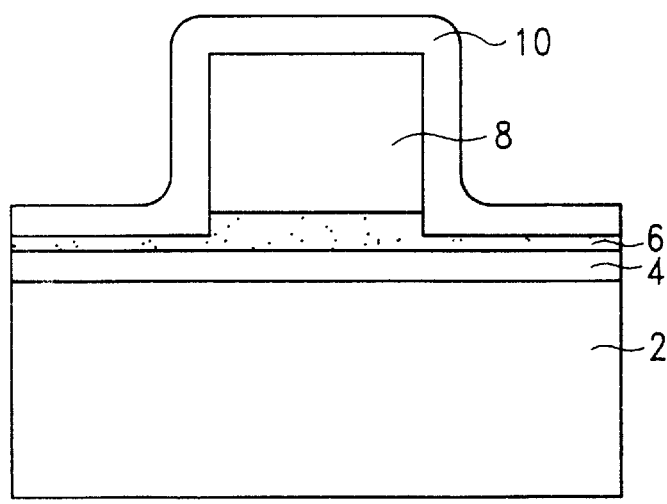
FIG. 2 is a cross-sectional view of a semiconductor wafer illustrating a next stage in accordance with the present invention.
Figure 3:
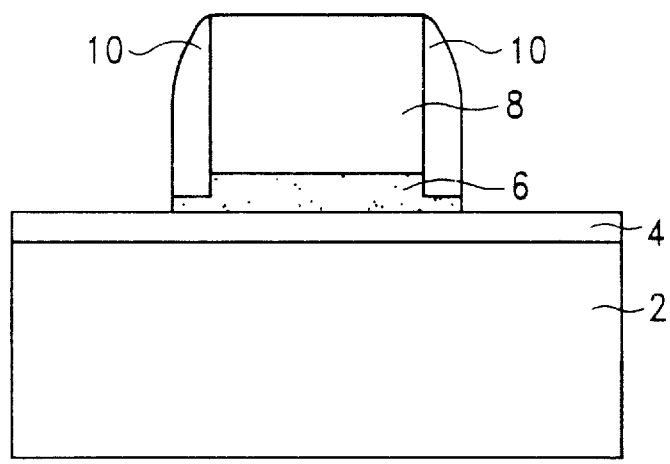
FIG. 3 is a cross-sectional view of a semiconductor wafer illustrating a further stage in accordance with the present invention.

Now referring to FIG. 2, a TEOS-oxide layer 10 is deposited on the first silicon oxynitride layer 6 and on the silicon nitride layer 8. As shown in FIG. 3, an anisotropical etching is then carried out to anisotropically etch the TEOS-layer 10, thereby forming sidewall spacers 12 on the sidewalls of the etched silicon nitride layer 8. The etching continues to the top surface of the silicon oxide layer 4. It should be noted that protruded portions 6a of the first silicon rich silicon oxynitride layer 6 are formed under the sidewall spacers 12. Further, the areas on the wafer 2 under the sidewall spacers 12 are used to form isolation regions between devices. The dimensions, or scale, of the isolation regions are dependent on the widths of the sidewall spacers 12. Thus, the scale of the isolation regions can be controlled by forming the sidewall spacers 12 and the isolation regions can be defined beyond the limitation of photolithography.

Figure 4:
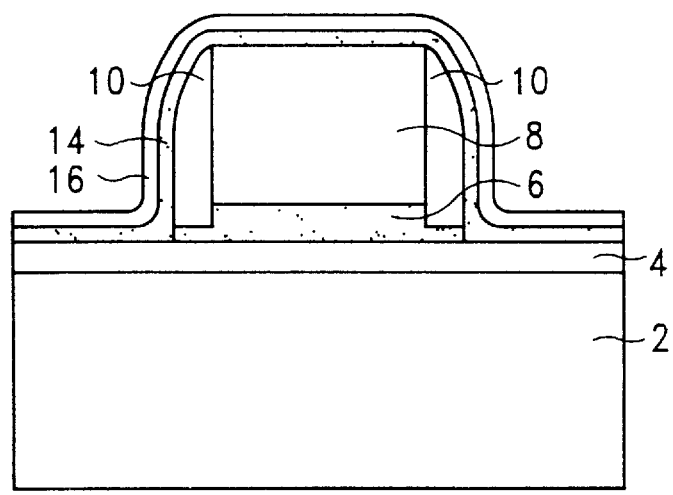
FIG. 4 is a cross-sectional view of a semiconductor wafer illustrating a further stage in accordance with the present invention.

Turning to FIG. 4, a second oxygen rich silicon oxynitride layer 14 is subsequently deposited along the surface of the profile described above. In other words, the second oxygen rich silicon oxynitride layer 14 is formed on the silicon nitride layer 8, the sidewall spacers 12, and the silicon oxide layer 4. Next, a second silicon nitride layer 16 is deposited on the second oxygen rich oxynitride layer 14.

Figure 5:
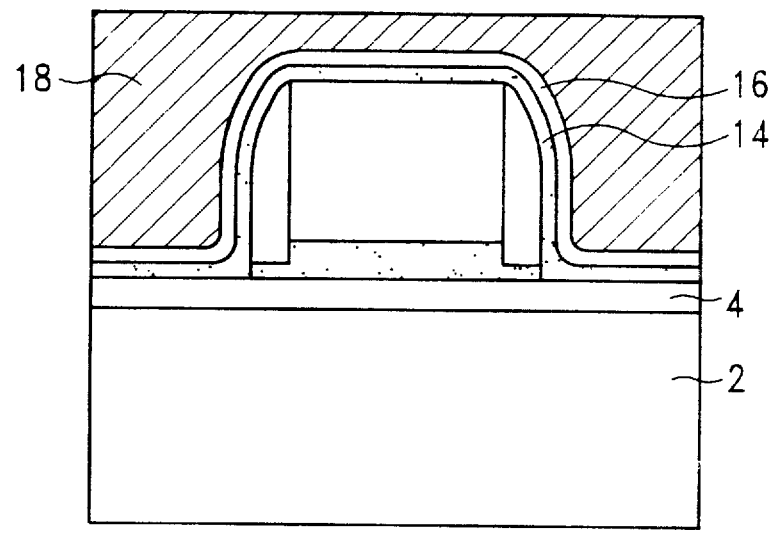
FIG. 5 is a cross-sectional view of a semiconductor wafer illustrating a further stage in accordance with the present invention.
Figure 6:
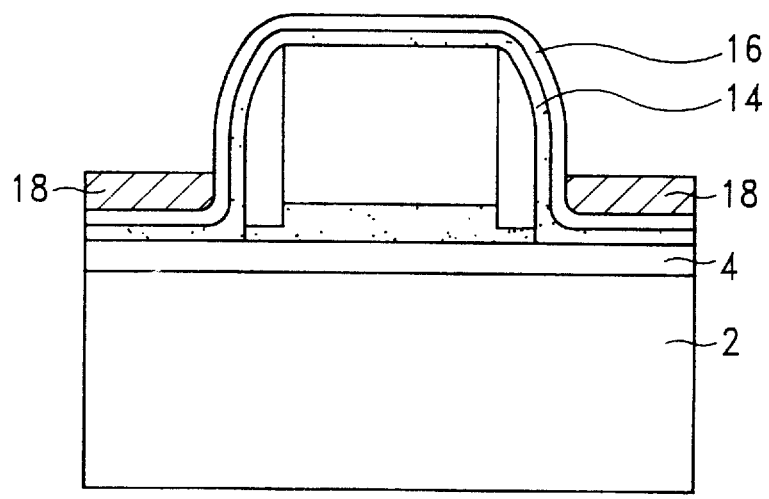
FIG. 6 is a cross-sectional view of a semiconductor wafer illustrating a further stage in accordance with the present invention.

Referring now to FIG. 5, after the second silicon nitride layer 16 is formed, a sacrificial oxide layer 18 is deposited on the second silicon nitride layer 16 PSG and BPSG or oxide are suitably used as the sacrificial oxide layer 18. Subsequently, the sacrificial oxide layer 18 is etched until portions of the sidewall spacers 12 are revealed. The sacrificial oxide layer 18 is suitably removed by using hydrofluoric acid (HF) or buffer oxide etching solution (BOE). The resultant structure after the etching is shown in FIG. 6. The residual oxide layer 18 serves as an etching mask for subsequent processing, described in detail below.

Figure 7:
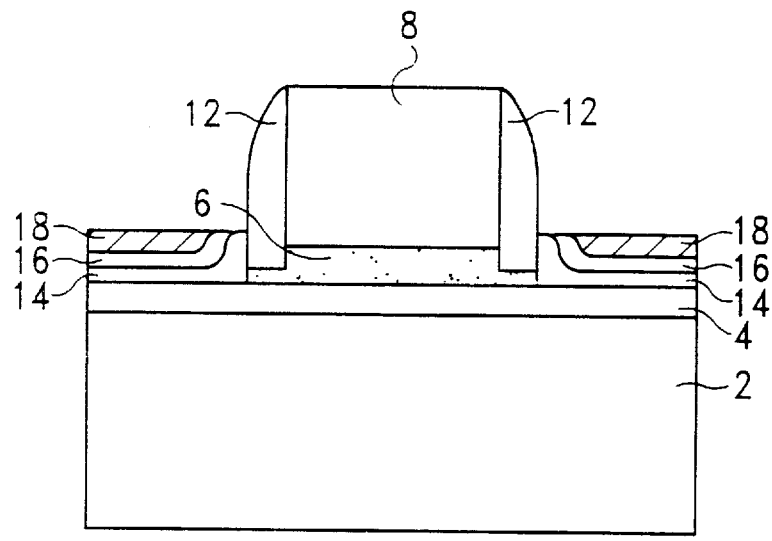
FIG. 7 is a cross-sectional view of a semiconductor wafer illustrating a further stage in accordance with the present invention.

As shown in FIG. 7, the second oxygen rich silicon oxynitride layer 14 and the second silicon nitride layer 16 that are not covered by the oxide layer 18 are preferably removed by hot phosphorus acid solution, thereby exposing portions of the sidewall spacers 12. However, the second oxygen rich silicon oxynitride layer 14 and the second silicon nitride layer 16 are also suitably removed by dry etching using $CF_4$ plasma as the etchant.

Figure 8:
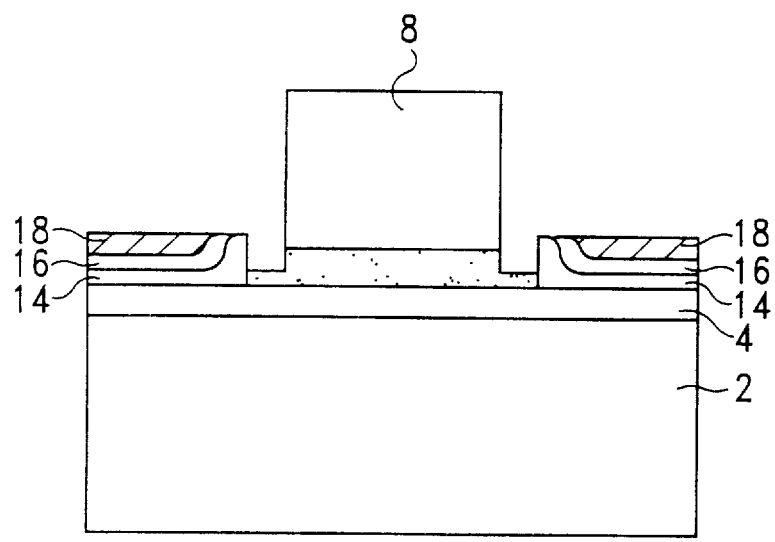
FIG. 8 is a cross-sectional view of a semiconductor wafer illustrating a further stage in accordance with the present invention.

Turning now to FIG. 8, the sidewall spacers 12 are subsequently removed using HF or BOE solution. Grooves 20 are thereby created adjacent the first silicon nitride layer 8. The protruded portions 6a of the first silicon rich silicon oxynitride layer 6 are exposed due to the shape of the sidewall spacers 12 and are stripped away.

Figure 9:
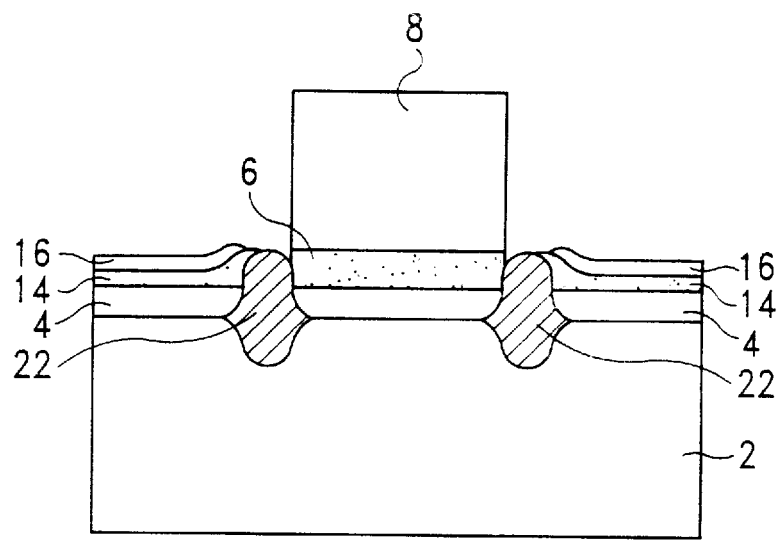
FIG. 9 is a cross-sectional view of a semiconductor wafer illustrating a further stage in accordance with the present invention.

As shown in FIG. 9, a thermal oxidation process is performed using the first silicon nitride layer 8 as a mask at a temperature between about 1000° to 1100° C. to form isolation regions 22 adjacent the first silicon nitride layer 8 and in the wafer 2. The second silicon nitride layer 16 and the second oxygen rich silicon oxynitride layer 14 suppress oxygen penetration into the wafer 2 during the oxidation process. Therefore, the conventional bird's beak effect is reduced by the method of the present invention. Further, the second oxygen rich silicon oxynitride layer 14 acts as a cushion between the silicon oxide layer 4 and the second silicon nitride layer 16 to reduce stress during oxidation.

Figure 10:
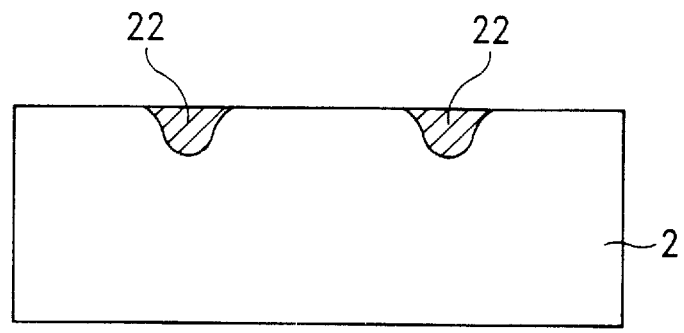
FIG. 10 is a cross-sectional view of a semiconductor wafer illustrating a further stage in accordance with the present invention.

Turning next to FIG. 10, the first silicon nitride layer 8, the second silicon nitride layer 16, and the second oxygen rich silicon oxynitride layer 14 are removed using a heated solution of phosphorus acid. Then, the silicon oxide layer is also removed by HF or BOE. Thus, isolation regions between devices are formed. Then, a blanket planarization is performed to remove portions of the isolation regions for achieving a planarization surface of the wafer 2, if desired. This planarization is suitably performed by a chemical mechanical polishing (CMP) process.

The bird's beak effect can be sufficiently reduced by the method of the present invention. The present invention uses silicon oxynitride and silicon nitride to serve as a buffer structure, which is referred to as Oxynitride Buffered LOCal Oxide of Silicon (OBLOCOS). TABLE 1 lists the lengths of the bird's beaks obtained with the prior art and with the present invention. The stress of the silicon nitride and the thickness of the isolation region are also listed in TABLE 1. In the conventional method, a pad oxide having a thickness of 350 angstroms is used. The length of the bird's beak obtained with the prior art is about 0.68 μm, the stress of the silicon nitride layer is about 7.55E8 dynes/$cm^2$, and the thickness of the field oxide (FOX) is 5900 Å. As is well known in the art, a long bird's beak and a thick FOX are both unacceptable for scaling down devices. In contrast, in the present invention, the oxide thickness is 350 Å, and the oxynitride thickness is 200 Å(OBLOCOS-1), the stress of the silicon nitride is about 3.14E8 dynes/cm², and the thickness of the FOX is about 5800 Å. In addition, OBLOCOS-2 shows that the thicknesses of the oxide and oxynitride are 350 and 500 Å, respectively. The data related to OBLOCOS-2 is shown in TABLE 1.

TABLE 1

|  | bird's beak | SiN stress | FOX thickness |
|---|---|---|---|
| conventional | 0.68 μm | 7.55E8 | 5900 Å |
| OBLOCOS-1 | 0.56 μm | 3.14E8 | 5800 Å |
| OBLOCOS-2 | 0.53 μm | 6.64E8 | 4900 Å |

As will be understood by a person skilled in the art, the foregoing embodiments illustrate rather than limit the present invention. It is intended that various modifications and similar arrangements are included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

What is claimed is:

1. A method for forming an isolation region between semiconductor devices on a semiconductor wafer, the method comprising:

forming a first pad layer on the wafer as a first block layer;

forming a first silicon nitride layer on said first pad layer;

patterning said first silicon nitride layer to expose first portions of the said pad layer;

removing said first portions of said first pad layer using said first silicon nitride layer as a mask;

forming sidewall spacers on the sidewalls of said first silicon nitride layer;

removing second portions of said first pad layer that are exposed by said first silicon nitride layer and said sidewall spacers;

forming a second pad layer on said first silicon nitride layer, the sidewall spacers, and said exposed first pad layer for acting as a second block layer;

forming a sacrificial oxide layer on said second pad oxide layer;

etching the sacrificial oxide layer to expose third portions of said second pad layer;

removing fourth portions of said second pad layer to expose fifth portions of said sidewall spacers using said sacrificial oxide layer as a mask;

removing said sidewall spacers using said sacrificial oxide layer as a mask to form grooves between said first silicon nitride layer and said second pad layer, the grooves exposing the sixth portions of said first pad layer;

forming isolation regions in said grooves and in the wafer;

removing said first silicon nitride layer; and removing said first pad layer and said second pad layer.

2. The method of claim 1, further comprising:

performing a planarization on said wafer after removing said first pad layer and said second pad layer.

3. The method of claim 1, wherein said first pad layer comprises a first sublayer and a second sublayer, said first sublayer being formed on said wafer, said second sublayer being formed on said first sublayer, said first sublayer comprising silicon oxide and said second sublayer comprising a first silicon oxynitride.

4. The method of claim 3, wherein removing said first portions of said first pad layer stops at said first sublayer.

5. The method of claim 1, wherein said second pad layer comprises a third sublayer and a fourth sublayer, said forth sublayer being formed on said third sublayer, said third sublayer comprising a second silicon oxynitride and said fourth sublayer comprising a second silicon nitride.

6. The method of claim 1, wherein forming said sidewall spacers comprises:

forming an oxide layer on said first pad layer and on said first silicon nitride layer; and anisotropically etching said oxide layer.

7. The method of claim 6, wherein said oxide layer is a tetraethyl orthosilicate-oxide layer.

8. The method of claim 6, wherein said sidewall spacers are removed by HF etching.

9. The method of claim 6, wherein said sidewall spacers are removed by buffer oxide etching.

10. The method of claim 1, wherein said sacrificial oxide layer comprises BPSG.

11. The method of claim 1, wherein said sacrificial oxide layer comprises BSG.

12. The method of claim 10, wherein the etchant for removing said sacrificial oxide layer is selected from said group consisting of BOE and HF.

13. The method of claim 11, wherein the etchant for removing said sacrificial oxide layer is selected from said group consisting of BOE and HF.

14. The method of claim 1, wherein forming said isolation regions comprises performing thermal oxidation.

* * * * *